United States Patent
Lee et al.

(10) Patent No.: US 7,776,723 B2
(45) Date of Patent: Aug. 17, 2010

(54) METHOD OF MANUFACTURING AN EPITAXIAL SEMICONDUCTOR SUBSTRATE AND METHOD OF MANUFACTURING A SEMICONDUCTOR DEVICE

(75) Inventors: Ho Lee, Gyeonggi-do (KR); DongSuk Shin, Youngin-si (KR); Tetsuji Ueno, Suwon-si (KR); Seung-Hwan Lee, Seoul (KR); Hwa-Sung Rhee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 712 days.

(21) Appl. No.: 11/192,085

(22) Filed: Jul. 29, 2005

(65) Prior Publication Data
US 2006/0175613 A1  Aug. 10, 2006

(30) Foreign Application Priority Data
Feb. 7, 2005  (KR)  ............................ 2005-0011459

(51) Int. Cl.
*H01L 21/322*  (2006.01)
(52) U.S. Cl. ..................... 438/476; 438/477; 438/471; 438/473; 438/143; 257/E21.318; 257/E21.321

(58) Field of Classification Search .................. 438/476, 438/471, 474, 473, 477, 143
See application file for complete search history.

(56) References Cited

U.S. PATENT DOCUMENTS

| 5,874,348 | A | 2/1999 | Takizawa et al. | |
|---|---|---|---|---|
| 6,228,453 | B1 * | 5/2001 | Fareed et al. | 428/43 |
| 6,342,436 | B1 | 1/2002 | Takizawa | |
| 6,344,092 | B1 | 2/2002 | Takizawa | |
| 6,548,382 | B1 * | 4/2003 | Henley et al. | 438/526 |
| 6,746,939 | B2 | 6/2004 | Shimozono et al. | |
| 2002/0094612 | A1 * | 7/2002 | Nakamura et al. | 438/149 |
| 2002/0127766 | A1 * | 9/2002 | Ries et al. | 438/94 |
| 2006/0240630 | A1 * | 10/2006 | Bauer et al. | 438/301 |

FOREIGN PATENT DOCUMENTS
EP  0 352 801 A2  1/1990

\* cited by examiner

*Primary Examiner*—Marcos D. Pizarro
*Assistant Examiner*—Eva Yan Montalvo
(74) *Attorney, Agent, or Firm*—Harness, Dickey & Pierce, P.L.C.

(57) ABSTRACT

In an example embodiment of the method of manufacturing an epitaxial semiconductor substrate, a gettering layer is grown over a semiconductor substrate. An epitaxial layer may then be formed over the gettering layer, and a semiconductor device may be formed on the epitaxial layer.

29 Claims, 6 Drawing Sheets

METHOD OF MANUFACTURING AN EPITAXIAL SEMICONDUCTOR SUBSTRATE AND METHOD OF MANUFACTURING A SEMICONDUCTOR DEVICE

PRIORITY STATEMENT

This application claims priority under 35 U.S.C. §119, from Korean Patent Application No. 2005-0011459 filed on Feb. 7, 2005 in the Korean Intellectual Property Office, the disclosure of which is incorporated herein by reference in its entirety.

BACKGROUND OF THE INVENTION

Gettering is a process of removing device-degrading impurities from the active circuit regions of a semiconductor wafer. As such, gettering helps enhance the yield of VLSI manufacturing.

Generally, there are three gettering mechanisms by which impurities are removed from a device region of a semiconductor substrate. One mechanism involves precipitating the impurities. Another mechanism involves diffusing impurities through the silicon, and yet another involves trapping impurities (e.g., metal atoms) in defects such as dislocations or precipitates in an area away from the device region.

The gettering mechanisms may be placed in two general classifications: extrinsic and intrinsic. Extrinsic gettering refers to employing external techniques to create damage or stress in the silicon lattice such that the resulting defects in the lattice trap impurities. One example of extrinsic gettering is mechanically damaging a backside of a semiconductor wafer. For instance, abrasion, grooving or sandblasting may produce stress at the backside of the wafer. Subsequent annealing creates dislocations that tend to relieve the stresses inflicted on the wafer. These dislocations serve as gettering sites for trapping impurities.

Diffusing phosphorus into the wafer backside is another extrinsic gettering technique. This diffusion results in phosphorus vacancies or dislocations that serve as trapping sites for impurity atoms (e.g., gold). This diffusion may also form Si—P precipitates that may remove Ni impurities through interactions between Si self-interstitials and Ni atoms, nucleating $NiSi_2$ particles in the process.

Damage may also be introduced by scanning a laser beam across the backside of the wafer. This is very similar to mechanical extrinsic gettering mechanisms, but stress on the wafer is from thermal shock caused by the laser beam. Yet another extrinsic gettering technique is ion bombardment of the wafer backside. Here, high-energy ions induce stress in the lattices of the wafer backside.

One further extrinsic gettering technique involves the deposition of a polysilicon layer on the wafer backside. The polysilicon introduces grain boundaries and lattice disorder that may act as traps for mobile impurities.

As mentioned previously, besides extrinsic gettering, there also exists intrinsic gettering. Intrinsic gettering refers to the creation of impurity trapping sites by, for example, precipitating supersaturated oxygen out of the silicon wafer. Here, wafers are created with certain levels of oxygen (e.g., 15-19 ppma). During formation of a semiconductor device, the precipitation of supersaturated oxygen causes the growth of clusters and introduces stress in the wafer. Eventually, these stresses result in dislocation loops or stacking faults that serve as trapping sites for impurities.

SUMMARY OF THE INVENTION

In an example embodiment of the method of manufacturing an epitaxial semiconductor substrate, a gettering layer is grown over a semiconductor substrate. An epitaxial layer may then be formed over the gettering layer.

As examples, the gettering layer may include one of carbon, Ge, Sn and Pb. When carbon is used as the gettering material, the growing step may grow the gettering layer at a temperature of 500 to 750 degrees Celsius.

When grown, the gettering layer has a thickness greater than 50 nm. For example, the growing step grows the gettering layer to a thickness of 100 nm~1 um.

Also, in one embodiment, the growing step grows the gettering layer to have a peak carbon doping concentration of 1E18 to 1E21 atoms/cc.

In another embodiment, the growing step grows the gettering layers such that silicon lattice distortion is caused by gettering material atoms occupying silicon sites.

Furthermore, in one embodiment, the growing step grows the gettering layer such that the gettering layer has a gettering material concentration with a non-Gaussian concentration profile over a thickness of the gettering layer.

In a further embodiment, the epitaxial layer is grown at a higher temperature than the temperature for forming the gettering layer.

To drive the gettering that the gettering layer provides, in one embodiment, a heat treatment is performed on the substrate including the gettering layer.

Further embodiments also include combining the gettering layer with any well-known gettering technique (intrinsic or extrinsic).

In an embodiment of the method of manufacturing a semiconductor device, a gettering layer is grown over a semiconductor substrate and an epitaxial layer is formed over the gettering layer. Then, a semiconductor element is formed on the epitaxial layer. For example, the semiconductor element may an image sensor.

In an embodiment of the semiconductor device according to the present invention, the semiconductor device includes a gettering layer formed over a substrate. The gettering layer has a gettering material concentration with a non-Gaussian concentration profile along a thickness of the gettering layer. An epitaxial layer is disposed over the gettering layer. And, a semiconductor device like an image sensor may then be disposed on the epitaxial layer.

In another embodiment of the semiconductor device according to the present invention, a semiconductor element is formed on the epitaxial layer.

In a still further embodiment of the semiconductor device, the semiconductor device includes a substrate, and a first epitaxial layer formed over the substrate. A gettering layer is formed over the first epitaxial layer to a thickness of 100 nm to 1 um, and the gettering layer has a gettering material concentration with a non-Gaussian concentration profile along a thickness of the gettering layer. A second epitaxial layer formed over the gettering layer.

BRIEF DESCRIPTION OF THE DRAWINGS

The present invention will become more fully understood from the detailed description given herein below and the accompanying drawings, wherein like elements are represented by like reference numerals, which are given by way of illustration only and thus are not limiting of the present invention and wherein.

DETAILED DESCRIPTION OF EXAMPLE EMBODIMENTS

Figure 1:
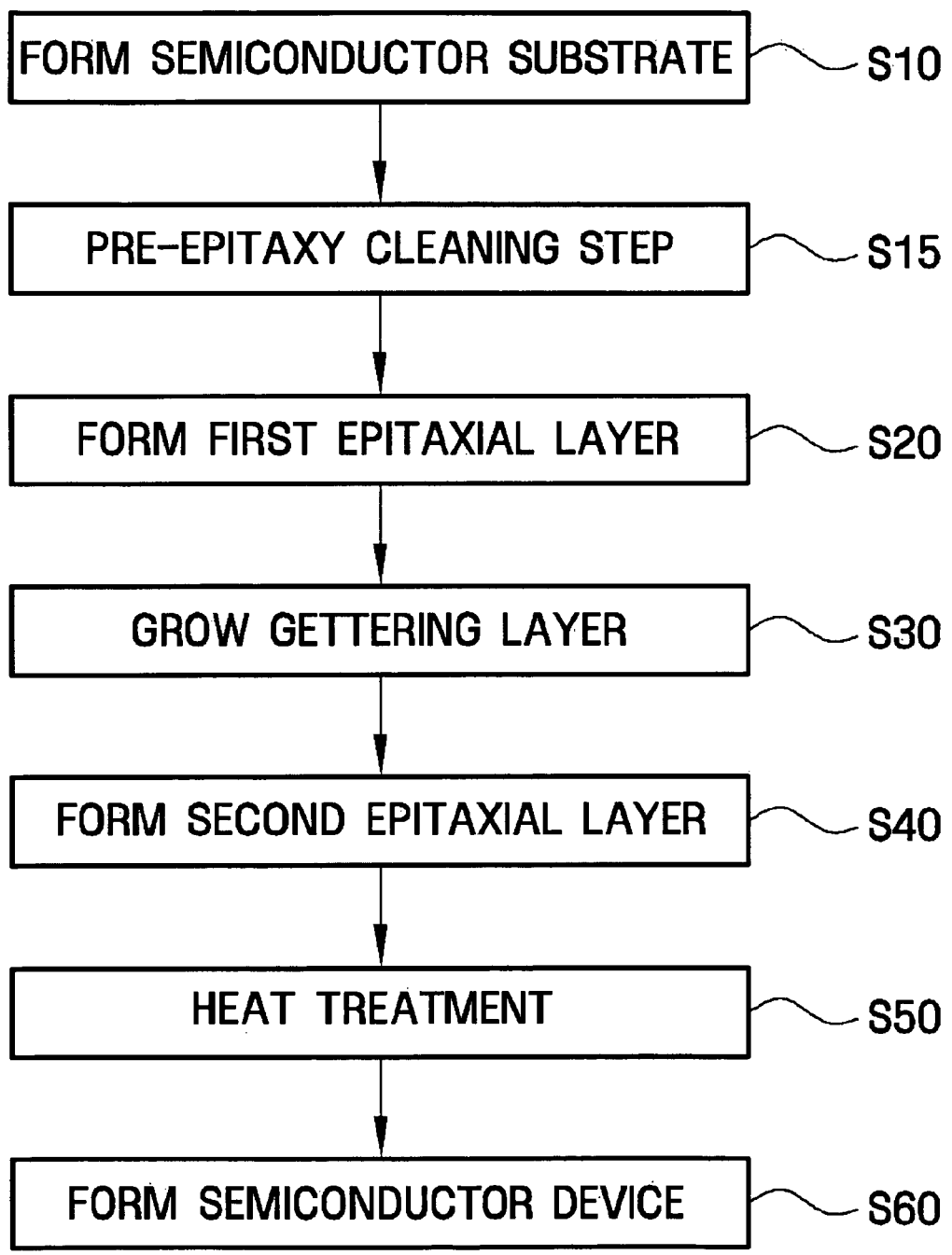
FIG. 1 illustrates a flow chart of an embodiment of the method for manufacturing an epitaxial layer and semiconductor device according to the present invention.
Figure 2:
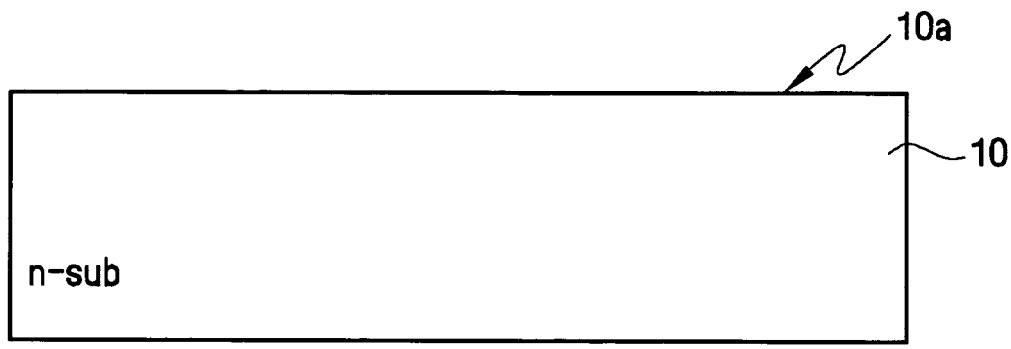
FIGS. 2-6 illustrate cross-sections of a semiconductor substrate after each of the processing steps illustrated in FIG. 1.

FIG. 1 illustrates a flow chart of an embodiment of the method for manufacturing an epitaxial layer and semiconductor device according to the present invention, and FIGS. 2-6 illustrate cross-sections of a semiconductor substrate after each of the processing steps illustrated in FIG. 1. As shown, in step S10 of FIG. 1, a semiconductor substrate is formed. Referring to FIG. 2, a single crystalline ingot is grown by the well-known Czochoralski (CZ) method. Then, the ingot is cut into a wafer, for example, having a resistance of about 10 Ωcm. The upper surface 10a of the wafer 10 (hereinafter referred to as the "substrate") is mirror finished. The substrate 10 then undergoes N-type doping and cleaning.

Figure 3:
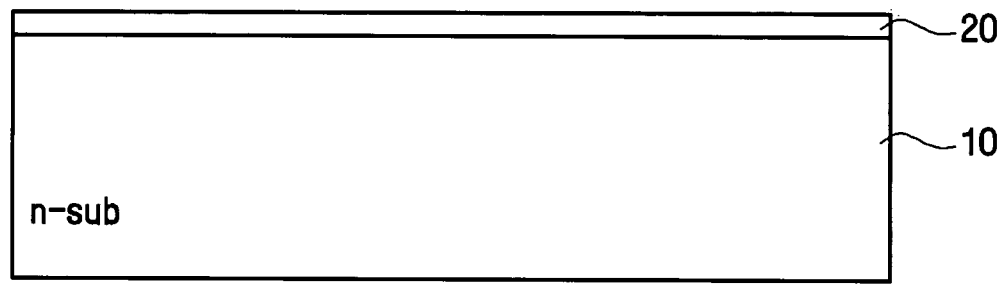

Next, a pre-epitaxy cleaning step is performed to remove residual oxide on the upper surface 10a. For example, the well-known hydrogen annealing method may be performed. In one embodiment, hydrogen gas is flowed at a pressure of about 1~100 Torr without any other gas flow, and annealing is concurrently performed for 1~5 min. Then, in step S20 of FIG. 1, as illustrated in FIG. 3, a seed layer or first epitaxial layer 20 is grown on the substrate 10. In one embodiment, steps S15 and S20 may be performed in the same equipment (in-situ). For example, the first epitaxial layer 20 may be grown to a thickness of 10~100 nm. According to one embodiment, the first epitaxial layer 20 is grown by chemical vapor deposition (CVD) at a temperature between 500-800 degrees Celsius and a pressure between 10~40 Torr. Silane may be used as the silicon source. According to another embodiment, the first epitaxial layer 20 is grown by CVD at a temperature between 1050~1100 degrees Celsius and a pressure between 30-60 Torr. In either embodiment, one of dichlorine silane (DCS), tetra-chlorine silane (TCS), hexa-chlorine silane, silane, disilane, etc. may be used as the silicon source during the CVD process. Also, in either embodiment, one of phosphane ($PH_3$), borane ($B_2H_6$), etc. may be used as a dopant source during the CVD process. For example, in one embodiment, Si source is supplied at a flow rate of about 200 sccm, and dopant source (e.g., diluted PH3) is supplied at a rate of about 51~10 sccm. The resulting first epitaxial layer 20 has a resistance of 20-150 Ωcm. As will be appreciated, this formation of the first epitaxial layer 20 is not limited to these process conditions, or the use of CVD as the formation process. For example, the well-known molecular beam epitaxy (MBE) method may be used.

Figure 4:
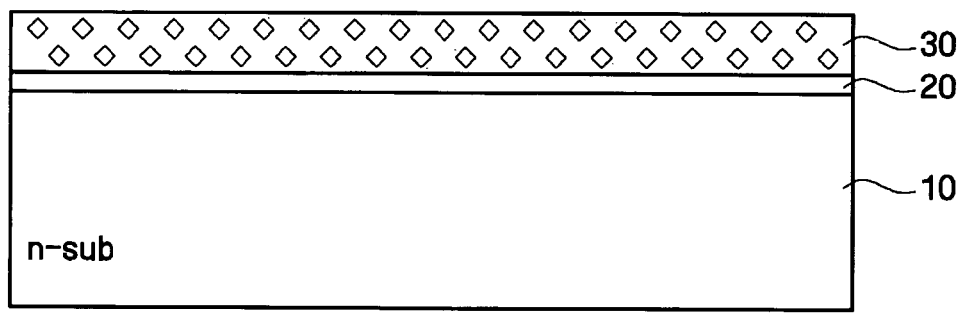

Next, in step S30 of FIG. 1 and as shown in FIG. 4, a gettering layer 30 is grown by, for example, CVD over the substrate 20 on the first epitaxial layer 20. The gettering layer 30 is grown to a thickness greater than 50 nm. For example, the gettering layer 30 may be grown to a thickness of 100 nm~1 um, but the present invention is not limited to this thickness range.

In growing the gettering layer 30, a silicon source and a gettering material source are used. The silicon source may be the same as used in growing the first epitaxial layer 20. The gettering material includes an element from Group IV of the periodic table such as carbon, germanium, tin and lead. For example, $SiH_3CH_3$, $CH_4$, $C_2H_4$, etc. may serve as the gettering material source when carbon is chosen as the gettering material. Optionally, a dopant source (e.g., phosphane ($PH_3$), borane ($B_2H_6$), etc.) may be additionally used.

When carbon is the gettering material, according to one example embodiment, the gettering layer 30 is grown by CVD at a temperature of 500-750 degrees Celsius and a pressure of 10-40 Torr. The gettering layer 30 is grown such that a peak concentration of the gettering material in the gettering layer 30 is 1E18~1E21. For example, the gettering layer 30 may be grown by supplying SiH4 at 100 sccm, $SiH_3CH_3$ at 10 sccm and $PH_3$ at 20 sccm.

The temperature at which the gettering layer 30 is grown affects the lattice structure of the gettering layer 30. For example, the gettering layer may be grown such that the gettering material is substitutial in the silicon lattice structure. Here, gettering material atoms replace silicon atoms in the lattice structure. When grown at higher temperatures, the gettering layer may be grown such that the gettering material is interstitial in the silicon lattice structure. Here, the gettering material atoms fill interstitial spaces in the silicon lattice structure. Depending on the gettering material and process conditions, above a certain temperature the gettering material is more interstitial then substitutial and below the temperature the gettering material is more substitutial than interstitial. For example, carbon is more substitutial when the process temperature is less than or equal to 750 degrees Celsius and more interstitial when the temperature is above 750 degrees Celsius. Accordingly, in the above described embodiment, by setting the process temperature to 500-750 degrees Celsius, the carbon is more substitutial than interstitial.

Furthermore, it will be appreciated that growing the gettering layer is not limited to CVD, and instead any well-known process for growing a semiconductor layer may be used.

Figure 5:
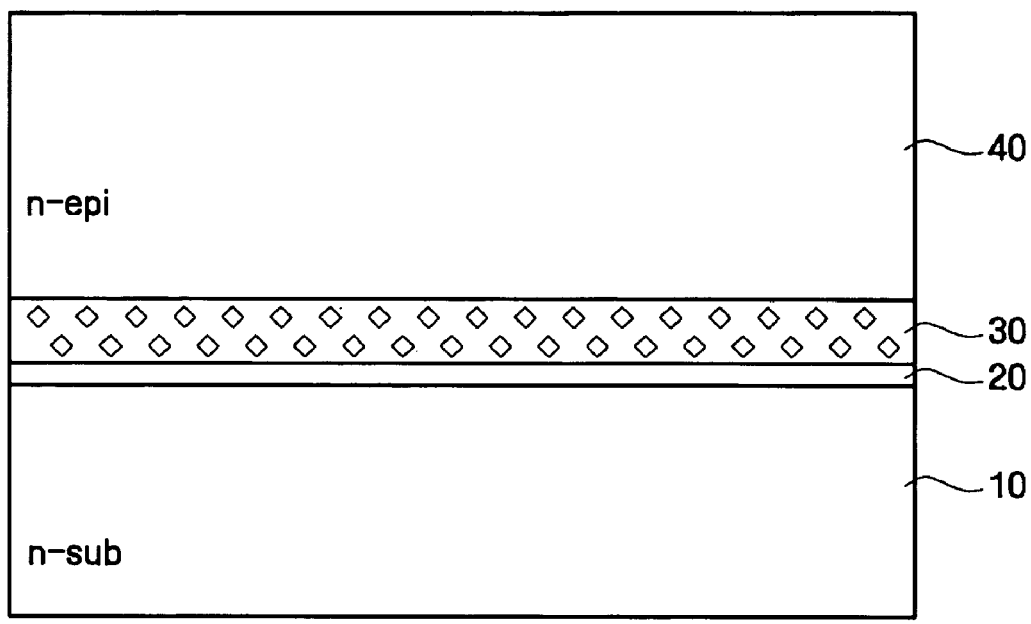

Subsequently, in step S40 of FIG. 1 and as shown in FIG. 5, a second epitaxial layer 40 is formed over the substrate 10 on the gettering layer 30. For example, the second epitaxial layer 40 may be grown to a thickness of 5~10 μm. According to one embodiment, the second epitaxial layer 40 is grown by chemical vapor deposition (CVD) at a temperature greater than 1000 degrees Celsius (e.g., between 1000-1100 degrees Celsius) and a pressure between 10~760 Torr. One of dichlorine silane (DCS), tetra-chlorine silane (TCS), hexa-chlorine silane, silane, disilane, etc. may be used as the silicon source during the CVD process. Also, one of phosphane ($PH_3$), borane ($B_2H_6$), etc. may be used as a dopant source during the CVD process. For example, the second epitaxial layer 40 may be grown by supplying DCS at 300 sccm and phosphane at 10 sccm. The resulting second epitaxial layer 40 has a resistance of 20-150 Ωcm. As will be appreciated, this formation of the second epitaxial layer 40 is not limited to these process conditions, or the use of CVD as the formation process.

Following step S40, a heat treatment is performed as shown in step S50 of FIG. 1. The heat treatment drives the gettering process. Namely, the heat treatment is the drive mechanism to precipitate impurities into the gettering layer 30 where the impurities are then trapped. In one embodiment, the heat treatment involves heating the substrate 10 at a temperature of 450-750 degrees Celsius for 30 minutes. In another embodiment, the heat treatment involves heating the substrate 10 from room temperature to 800-1000 degrees Celsius at a ramping up rate of 3 degrees Celsius per minute and then annealing is performed for over 10 min, and subsequently cooling the substrate 10 back down to room temperature at a cooling rate of 3 degrees Celsius per minute. This heating and cooling may be repeated. It will be appreciated that while the cooling rate and heating rate are the same in this example, the present invention is not limited to this. Also, the present invention is not limited to these two embodiments for driving the gettering process.

Figure 6:
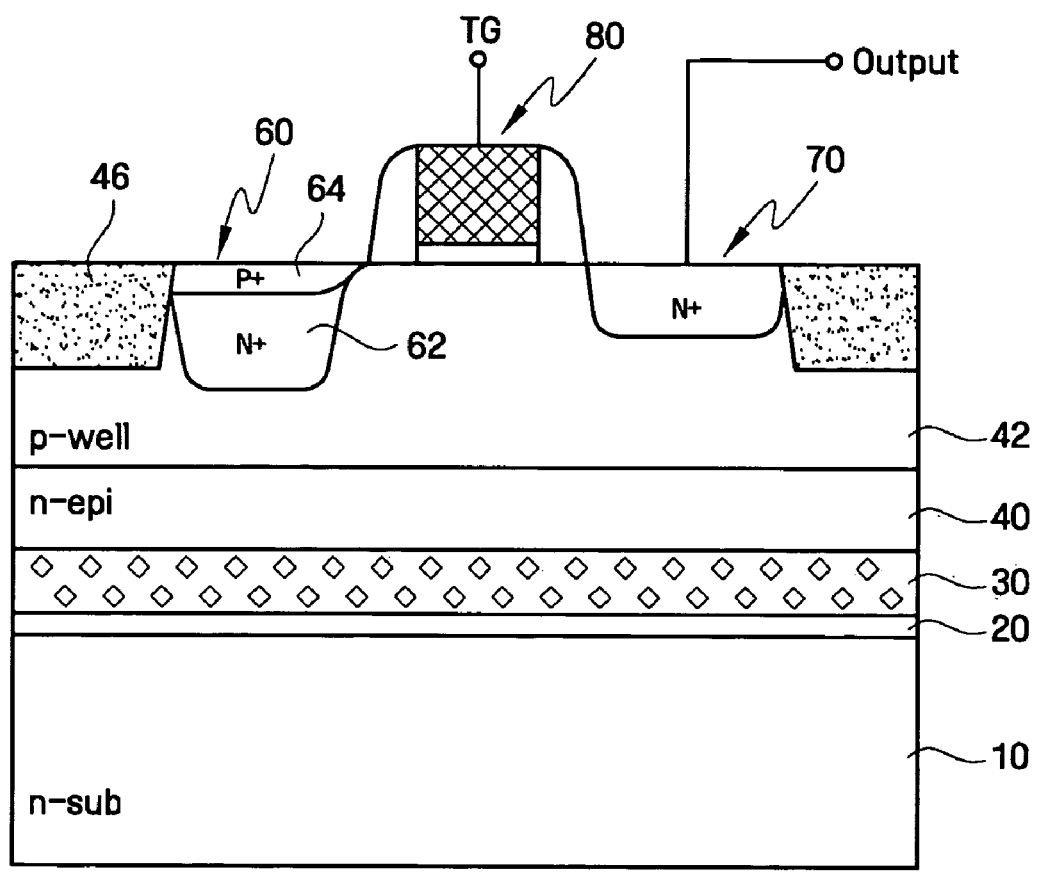

Next, in step S60 of FIG. 1, a semiconductor device is formed on the epitaxial semiconductor substrate manufactured according to step S10-S50. For example, the semiconductor device may be an image sensor such as shown in FIG. 6. However, it will be understood that the present invention is not limited to having an image sensor as the semiconductor device formed on the epitaxial semiconductor substrate.

As shown in FIG. 6, a p-well 42 is formed in the second epitaxial layer 40 by doping the second epitaxial layer with a p-type dopant (e.g., boron). Isolation regions 46 are then formed in the p-well 42 to define an active region. A gate structure 80 is formed over the active region and N+ wells 62 are formed in the p-well 42 on either side of the gate structure 80. A P+ pinning layer 64 is formed in one of the N+ wells 62 to form a photo diode 60. The other N+ well 62 serves as the output of the image sensor. When a voltage is applied to the gate structure 80, the charge accumulated at the photo diode 60 is transferred to the output.

Figure 7:
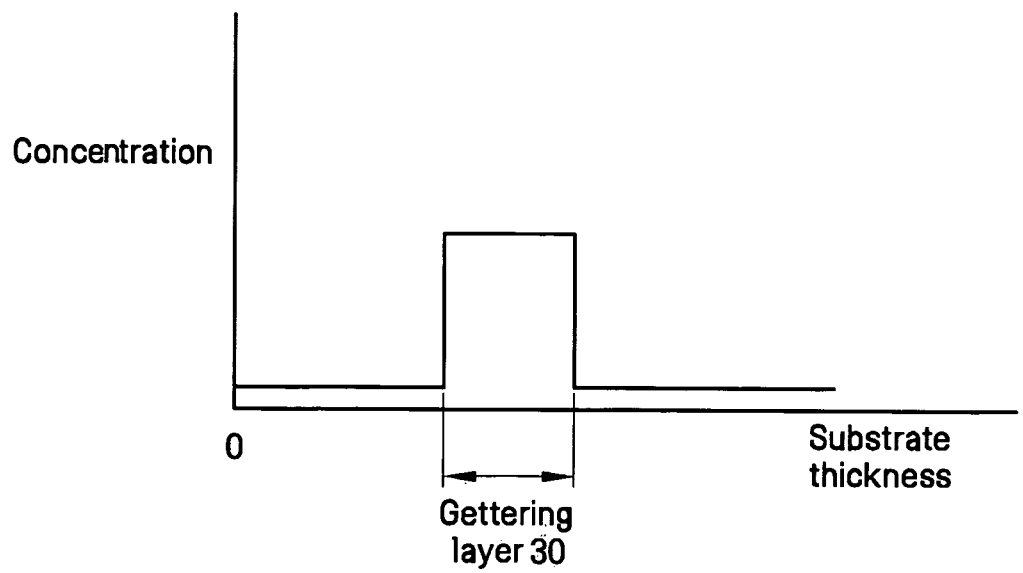
FIG. 7 illustrates a concentration profile of a gettering layer formed according to the embodiment of FIG. 1.

FIG. 7 illustrates the concentration profile of carbon along the thickness of the epitaxial semiconductor substrate manufactured according to steps S10-S50 of FIG. 1. As shown, the profile is decidedly non-Gaussian, and instead has a stepped shape at the thickness corresponding to the gettering layer 30.

Figure 8:
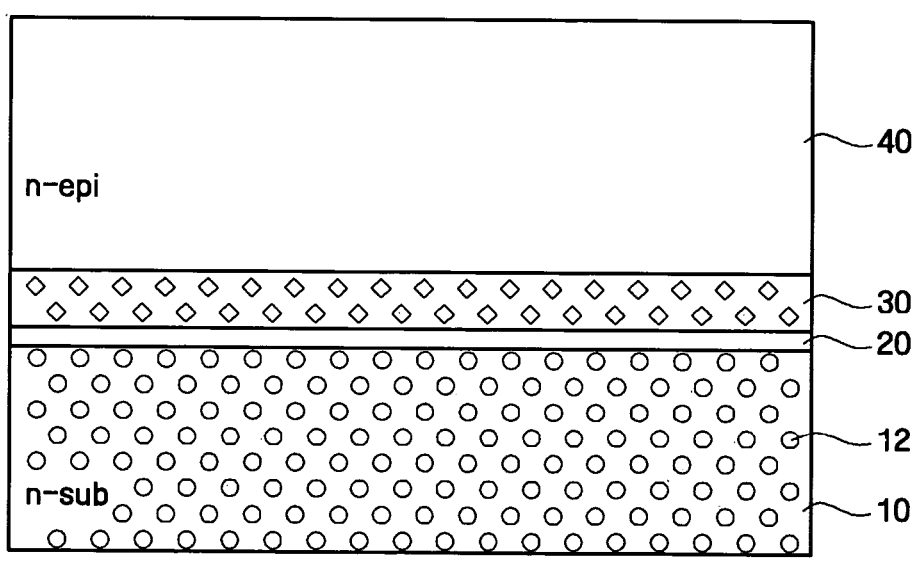
FIG. 8 illustrates a cross-section of a semiconductor substrate formed according to another embodiment of the present invention.

Next, another embodiment of the present invention will be described. This embodiment is the same as the embodiment of FIG. 1, except for the manner in which the wafer is manufactured in step S10. In this embodiment, as shown in FIG. 8, the wafer is formed in any well-known manner such that the substrate 10 includes supersaturated oxygen. As result, during the heat treatment process of step S50, the supersaturated oxygen is precipitated in the substrate 10. Namely, oxygen clusters in the substrate 10 causing dislocations that then trap impurities.

Figure 9:
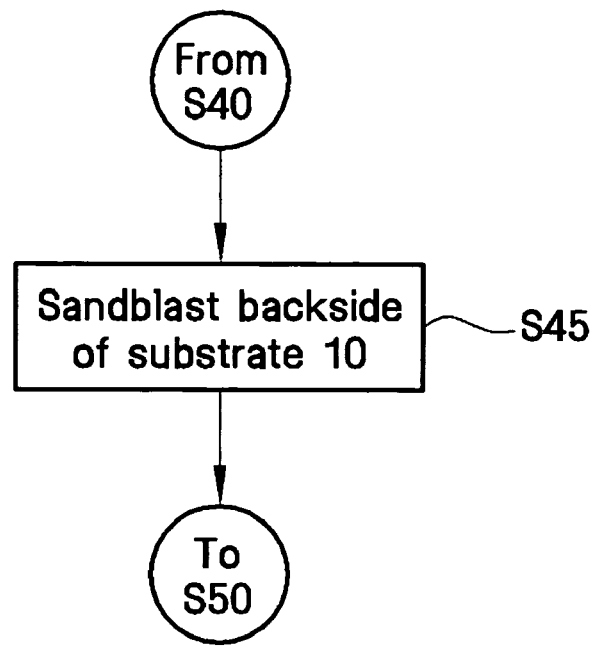
FIG. 9 illustrates a flow chart of another embodiment of the method for manufacturing an epitaxial layer and semiconductor device according to the present invention.
Figure 10:
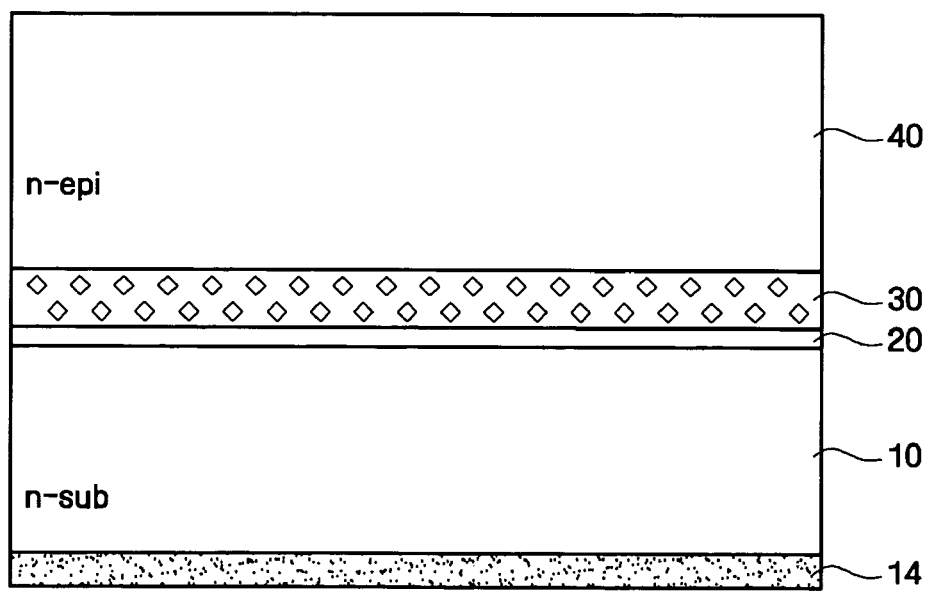
FIG. 10 illustrates a cross-section of an epitaxial semiconductor substrate formed according to the embodiment of FIG. 9.

According to a third embodiment of the present invention, the same method as described in FIG. 1 is conducted, but in conjunction with the gettering achieved with the gettering layer 30, any well-known extrinsic gettering process such as described in the background section of this disclosure is also performed. For example, as shown in FIG. 9, before the heat treatment process of step S50 in FIG. 1, the backside of the substrate 10 is sandblasted in step S45 to form a damaged layer 14 as shown in FIG. 10. The heat treatment step S50 then drives both the gettering mechanism of the gettering layer 30 and the extrinsic gettering of the sandblasting.

The invention being thus described, it will be obvious that the same may be varied in many ways. Such variations are not to be regarded as a departure from the spirit and scope of the invention, and all such modifications as would be obvious to one skilled in the art are intended to be included within the scope of the invention.

We claim:

1. A method of manufacturing an epitaxial semiconductor substrate, comprising:
  performing a pre-epitaxial cleaning on a semiconductor substrate;
  forming a first epitaxial layer on the semiconductor substrate;
  growing a gettering layer on the first epitaxial layer with a chemical vapor deposition method or a molecular beam epitaxy method, wherein carbon is incorporated into the gettering layer during formation of a lattice structure of the gettering layer during the chemical vapor deposition method or molecular beam epitaxy method; and
  forming a second epitaxial layer over the gettering layer.

2. The method of claim 1, wherein the growing step is performed by ion in-situ doping.

3. The method of claim 2, wherein the gettering layer further includes at least one of Ge, Sn, and Pb.

4. The method of claim 1, wherein the growing step grows the gettering layer using one of $SiH_3CH_3$, $CH_4$ and $C_2H_4$ as a source of the carbon.

5. The method of claim 1, wherein the growing step grows the gettering layer by chemical vapor deposition using a silicon source.

6. The method of claim 1, wherein the growing step grows the gettering layer by chemical vapor deposition using a silicon source and one of a phosphorous source and a boron source.

7. The method of claim 1, wherein the growing step grows the gettering layer at a temperature of 500 to 750 degrees Celsius.

8. The method of claim 7, wherein the growing step grows the gettering layer to a thickness greater than 50 nm.

9. The method of claim 8, wherein the growing step grows the gettering layer to a thickness of 100 nm~1 um.

10. The method of claim 9, wherein the growing step grows the gettering layer to have a peak carbon doping concentration of 1E18 to 1E21 atoms/cc.

11. The method of claim 7, wherein the growing step grows the gettering layer to have a peak carbon doping concentration of 1E18 to 1E21 atoms/cc.

12. The method of claim 1, wherein the growing step grows the gettering layer to a thickness greater than 50 nm.

13. The method of claim 12, wherein the growing step grows the gettering layer to a thickness of 100 nm~1 um.

14. The method of claim 1, wherein the growing step grows the gettering layer to have a peak carbon doping concentration of 1E18 to 1E21 atoms/cc.

15. The method of claim 1, wherein the growing step grows the gettering layers such that silicon lattice distortion is caused by carbon occupation of silicon sites.

16. The method of claim 1, wherein the growing step grows the getting layer by in-situ ion doping such that silicon lattice distortion is caused by gettering material atoms occupying silicon sites.

17. The method of claim 1, wherein the growing step grows the gettering layer to a thickness greater than 50 nm.

18. The method of claim 17, wherein the growing step grows the gettering layer to a thickness of 100 nm~1 um.

19. The method of claim 1, wherein the growing step grows the gettering layer at a temperature lower than a temperature at which the forming step of forming the second epitaxial layer forms the second epitaxial layer.

20. The method of claim 1, wherein the forming step of forming the second epitaxial layer forms the second epitaxial layer at a temperature greater than or equal to 1000 degrees Celsius.

21. The method of claim 1, further comprising:
performing a heat treatment on the semiconductor substrate after forming the second epitaxial layer to drive a gettering process.

22. The method of claim 21, wherein the heat treatment includes heating the semiconductor substrate to 450 to 750 degrees Celsius for a period of time.

23. The method of claim 21, wherein the heat treatment includes heating the semiconductor substrate from a first temperature to a second temperature at a ramping rate and then cooling the semiconductor substrate at a cooling rate.

24. The method of claim 1, further comprising:
providing, before the growing step, a semiconductor substrate having supersaturated oxygen.

25. The method of claim 24, further comprising:
performing a heat treatment on the semiconductor substrate after forming the second epitaxial layer to drive gettering by the gettering layer and precipitate the supersaturated oxygen in the semiconductor substrate.

26. The method of claim 1, further comprising:
performing an extrinsic gettering process in conjunction with the growing and forming steps.

27. The method of claim 1, wherein the growing step grows the gettering layer such that the gettering layer has a gettering material concentration with a non-Gaussian concentration profile along a thickness of the gettering layer.

28. A method of manufacturing a semiconductor device, comprising:
performing a pre-epitaxial cleaning on a semiconductor substrate;
forming a first epitaxial layer on the semiconductor substrate;
growing a gettering layer on the first epitaxial layer with a chemical vapor deposition method or a molecular beam epitaxy method, wherein carbon is incorporated into the gettering layer during formation of a lattice structure of the gettering layer during the chemical vapor deposition method or molecular beam epitaxy method;
forming second epitaxial layer over the gettering layer; and
forming a semiconductor element on the second epitaxial layer.

29. The method of claim 28, wherein the semiconductor element is an image sensor.

* * * * *